(12) United States Patent
Nangou et al.

(10) Patent No.: US 11,945,195 B2
(45) Date of Patent: Apr. 2, 2024

(54) WATER BARRIER LAMINATE

(71) Applicant: TOYO SEIKAN GROUP HOLDINGS, LTD., Tokyo (JP)

(72) Inventors: Shunya Nangou, Yokohama (JP); Shinpei Okuyama, Yokohama (JP); Misato Kawanishi, Yokohama (JP); Keisuke Takayama, Yokohama (JP)

(73) Assignee: TOYO SEIKAN GROUP HOLDINGS, LTD., Tokyo (JP)

( * ) Notice: Subject to any disclaimer, the term of this patent is extended or adjusted under 35 U.S.C. 154(b) by 114 days.

(21) Appl. No.: 17/431,108

(22) PCT Filed: Feb. 25, 2020

(86) PCT No.: PCT/JP2020/007396
§ 371 (c)(1),
(2) Date: Aug. 13, 2021

(87) PCT Pub. No.: WO2020/175454
PCT Pub. Date: Sep. 3, 2020

(65) Prior Publication Data
US 2022/0126549 A1 Apr. 28, 2022

(30) Foreign Application Priority Data
Feb. 25, 2019 (JP) ................. 2019-031273

(51) Int. Cl.
*B32B 27/08* (2006.01)
*B32B 7/12* (2006.01)
(Continued)

(52) U.S. Cl.
CPC ............. *B32B 27/08* (2013.01); *B32B 7/12* (2013.01); *B32B 27/36* (2013.01); *C09D 7/65* (2018.01);
(Continued)

(58) Field of Classification Search
CPC ......... H10K 50/84; B32B 27/00–27/42; B32B 7/00–7/14; B32B 2255/00–2255/28
See application file for complete search history.

(56) References Cited

U.S. PATENT DOCUMENTS

| 9,676,171 | B2 | 6/2017 | Okuyama et al. |
| 2016/0243801 | A1 | 8/2016 | Okuyama et al. |
| 2018/0236757 | A1* | 8/2018 | Nangou ................. H01B 1/124 |

FOREIGN PATENT DOCUMENTS

| JP | 11-333966 A | 12/1999 |
| JP | 2000-255579 A | 9/2000 |

(Continued)

OTHER PUBLICATIONS

International Search Report of PCT/JP2020/007396 dated May 26, 2020 [PCT/ISA/210].

(Continued)

*Primary Examiner* — Prashant J Khatri
(74) *Attorney, Agent, or Firm* — Sughrue Mion, PLLC

(57) ABSTRACT

A water barrier laminate including inorganic barrier and water-trapping layers alternately arranged in order from the side facing the device to the outer side: a first inorganic barrier layer, a first water-trapping layer, a second inorganic barrier layer, a second water-trapping layer and a third inorganic barrier layer. A water-permeable underlying plastic layer is provided on one side of these inorganic barrier layers; a distance L1a between the first water-trapping layer and the first inorganic barrier layer and a distance L2a between the second water-trapping layer and the second barrier satisfy formulas (1) and (2):

$$L1a < 3 \ \mu m \quad (1)$$

$$L2a < 3 \ \mu m \quad (2)$$

and a distance L1b between the second inorganic barrier layer and the first water-trapping layer satisfies formula (3):

$$L1b \leq 3 \ \mu m \quad (3)$$

(Continued)

by interposing a water-permeable organic layer therebetween.

10 Claims, 4 Drawing Sheets

(51) Int. Cl.
| | |
|---|---|
| *B32B 27/36* | (2006.01) |
| *C09D 7/65* | (2018.01) |
| *C09D 133/02* | (2006.01) |
| *C09J 7/29* | (2018.01) |
| *C09J 7/38* | (2018.01) |
| *C23C 14/10* | (2006.01) |
| *C23C 16/40* | (2006.01) |
| *C23C 16/50* | (2006.01) |
| *H10K 50/844* | (2023.01) |

(52) U.S. Cl.
CPC ............. *C09D 133/02* (2013.01); *C09J 7/29* (2018.01); *C09J 7/38* (2018.01); *C23C 14/10* (2013.01); *C23C 16/401* (2013.01); *C23C 16/50* (2013.01); *B32B 2255/10* (2013.01); *B32B 2255/20* (2013.01); *B32B 2255/205* (2013.01); *B32B 2307/7246* (2013.01); *B32B 2307/732* (2013.01); *C09J 2203/326* (2013.01); *C09J 2301/16* (2020.08); *C09J 2400/123* (2013.01); *C09J 2433/006* (2013.01); *C09J 2467/006* (2013.01); *C09J 2475/00* (2013.01); *H10K 50/844* (2023.02)

(56) References Cited

FOREIGN PATENT DOCUMENTS

| | | |
|---|---|---|
| JP | 2009-090633 A | 4/2009 |
| JP | 2014-168949 A | 9/2014 |
| JP | 2014-168950 A | 9/2014 |
| JP | 2015-208960 A | 11/2015 |
| JP | 2017-035829 A | 2/2017 |
| JP | 2017-039315 A | 2/2017 |
| WO | 2014/123197 A1 | 8/2014 |
| WO | 2015053340 A1 | 4/2015 |
| WO | 2016/006343 A1 | 1/2016 |
| WO | WO-2017030047 A1 * | 2/2017 ............. B32B 27/08 |

OTHER PUBLICATIONS

Office Action dated Sep. 14, 2022 issued by the Chinese Patent Office in Chinese Application No. 202080016564.8.

* cited by examiner

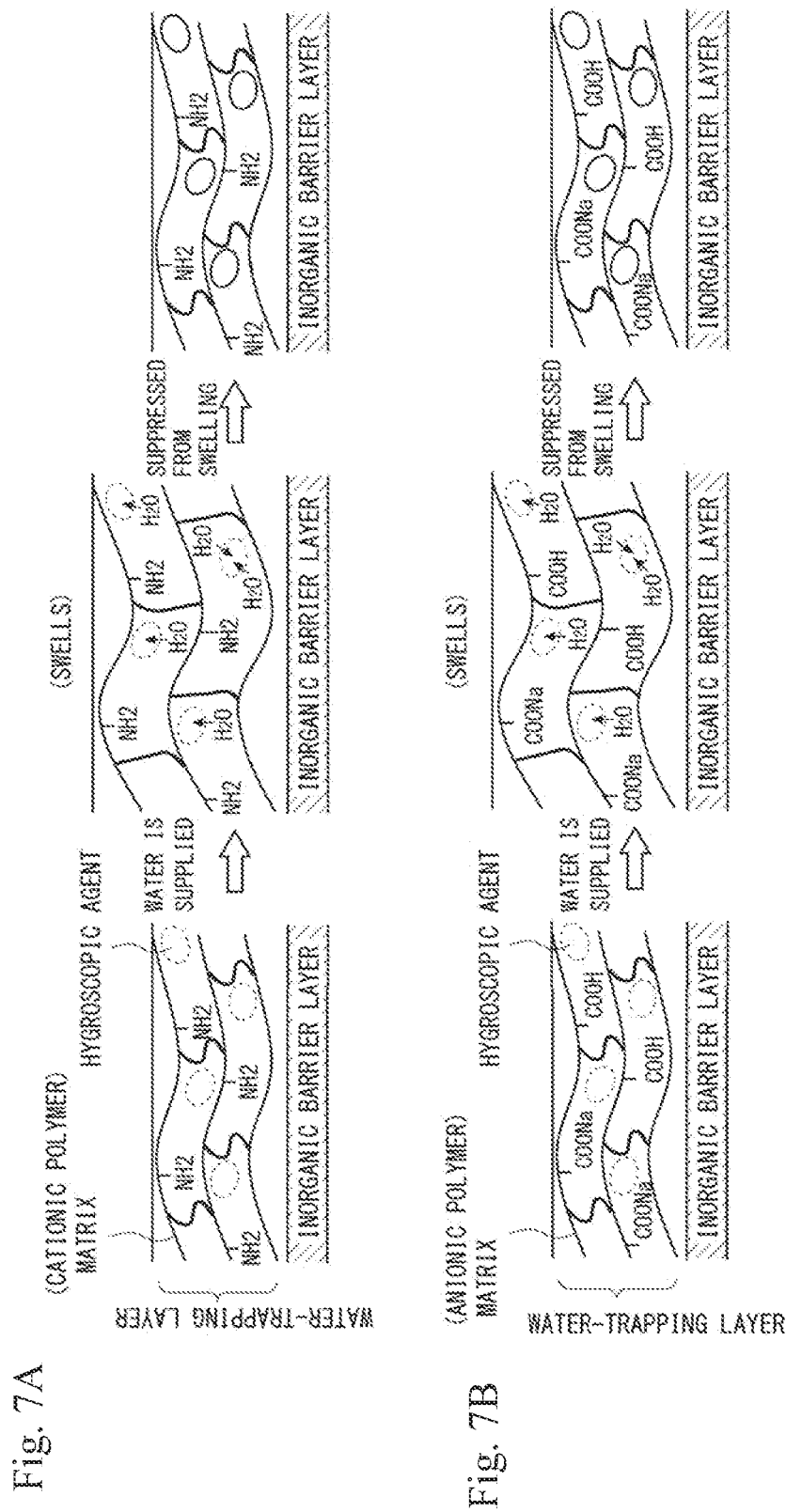

WATER BARRIER LAMINATE

CROSS REFERENCE TO RELATED APPLICATIONS

This application is a National Stage of International Application No. PCT/JP2020/007396, filed Feb. 25, 2020, claiming priority to Japanese Patent Application No. 2019-031273, filed Feb. 25, 2019.

TECHNICAL FIELD

This invention relates to a water barrier laminate used for preventing the water from permeating into the devices.

BACKGROUND ART

As means for improving properties and, specifically, gas-barrier property of various plastic base materials, there has been known an art of forming an inorganic barrier layer of a silicon oxide or an aluminum oxide by vacuum evaporation on the surfaces of the plastic base materials (patent document 1).

In a variety of electronic devices that have been developed and put into practice in recent years, such as organic electroluminescent (organic EL) devices, solar cells, touch panels, e-papers and the like, in order to avoid leakage of electric charges, a low-moisture atmosphere is maintained in the devices and, besides, it is required to impart a high degree of water barrier property to the plastic base materials forming the circuit boards or to the films sealing the circuit boards. However, the inorganic barrier layer formed as described above is not still capable of meeting a high degree of requirement for the water barrier property. Therefore, a variety of proposals have been made for improving the water barrier property.

For example, patent documents 2 to 5 filed by the present applicant are proposing gas barrier laminates in which a water-trapping layer of a specific granular hygroscopic agent dispersed in a matrix of an ionic polymer is formed on an inorganic barrier layer on a plastic base material.

Such gas barrier laminates exhibit very excellent super-barrier property against the water and are, therefore, capable of effectively preventing the external water from infiltrating into the devices.

The gas barrier laminate described above is usually used by being stuck to a device with an adhesive. However, there is a problem in that the water-trapping layer positioned closest to the device loses the water barrier property early. That is, the loss of the water barrier property of the water-trapping layer at this position means that this water-trapping layer is saturated with the water that the layer has absorbed. Once this occurs, then the water starts to be released from the water-trapping layer toward the device and the water barrier property is no longer maintained.

PRIOR ART DOCUMENTS

Patent Documents

Patent document 1: JP-A-2000-255579
Patent document 2: WO2014/123197
Patent document 3: JP-A-2014-168949
Patent document 4: JP-A-2014-168950
Patent document 5: JP-A-2017-39315

OUTLINE OF THE INVENTION

Problems that the Invention is to Solve

It is, therefore, an object of the present invention to provide a water barrier laminate used for preventing the water from permeating into the devices, wherein a water-trapping layer positioned on the side of the device is effectively suppressed from losing its effect over time and continues to exhibit its super-barrier property against the water for extended periods of time.

Means for Solving the Problems

According to the present invention, there is provided a water barrier laminate that includes a plurality of inorganic barrier layers and a plurality of water-trapping layers, and is used for preventing the water from permeating into a device, characterized in that:

the plurality of inorganic barrier layers include a first inorganic barrier layer, a second inorganic barrier layer and a third inorganic barrier layer, and the plurality of water-trapping layers include a first water-trapping layer and a second water-trapping layer;

the first to third inorganic barrier layers and the first and second water-trapping layers form a basic alternating layer structure in which the first inorganic barrier layer, the first water-trapping layer, the second inorganic barrier layer, the second water-trapping layer and the third inorganic barrier layer are arranged in this order from the side facing the device to the outer side;

a water-permeable underlying plastic layer is provided on one side of at least one of the first to third inorganic barrier layers;

a distance L1a between the first water-trapping layer and the first inorganic barrier layer and a distance L2a between the second water-trapping layer and the second barrier satisfy the conditions represented by the following formulas (1) and (2):

$$L1a < 3 \ \mu m \quad (1)$$

$$L2a < 3 \ \mu m \quad (2)$$

and a distance L1b between the second inorganic barrier layer and the first water-trapping layer is set to satisfy the condition represented by the following formula (3):

$$L1b > 3 \ \mu m \quad (3)$$

by interposing a water-permeable organic layer between these two layers.

The following embodiments can be preferably employed for the water barrier laminate of the present invention.
(1) The distance L1b (distance between the second inorganic barrier layer and the first water-trapping layer) is not more than 50 μm;
(2) Each of the plurality of inorganic barrier layers has a water permeability of not more than 0.1 $g/m^2$/day at 40° C., 90% RH;
(3) The water-permeable organic layer used for adjusting the distance is the underlying plastic layer that is present on one side of the second inorganic barrier layer;
(4) An adhesive layer is present between the first water-trapping layer and the second inorganic barrier layer;
(5) Any one or all of the plurality of inorganic barrier layers are vapor deposited layers of an aluminum oxide;

(6) A laminated structure including a water-trapping layer is further formed on the third inorganic barrier layer on the side away from the device;

(7) The plurality of water-trapping layers are formed of resin layers containing hygroscopic inorganic particles, hygroscopic ionic polymer layers or hygroscopic non-ionic polymer layers;

(8) The water-trapping layers have a structure formed by dispersing a hygroscopic agent in a hygroscopic matrix of an ionic polymer, the hygroscopic agent having an ultimate humidity lower than that of the matrix; and (9) The water barrier laminate is used being stuck to a device with an adhesive.

Effects of the Invention

The water barrier laminate of the present invention is used being fitted to such devices as organic EL devices in order to prevent the water from permeating into the devices. The water barrier laminate has a basic layer structure in which inorganic barrier layers and water-trapping layers are alternately located in the following order from the side facing the device to the outer side (side opposite to the device): the first inorganic barrier layer, the first water-trapping layer, the second inorganic barrier layer, the second water-trapping layer and the third inorganic barrier layer.

It is an important feature of the present invention that, in this basic structure, predetermined distances in the region of from the first inorganic barrier layer to the third inorganic barrier layer are set to lie within predetermined ranges so as to satisfy the above-mentioned formulas (1) to (3). That is, due to this basic structure in which the distances are adjusted as described above, the water-trapping layer (first water-trapping layer) located on the side of the device is suppressed from losing its performance in a short period of time. As a result, the water barrier laminate exhibits its performance for extended periods of time.

Through extensible experiments, it was discovered as a phenomenon that upon adjusting the distances as described above, the water-trapping layer (first water-trapping layer) located on the side of the device is suppressed from losing its performance in short periods of time. Though the reasons have not yet been clarified, the present inventors presume the reasons to be as described below.

Namely, the water barrier laminate is stuck to the electronic device using an adhesive and, therefore, the water is prevented from permeating into the device from the exterior. Here, however, the adhesive that is used may often contain the water. Besides, when the water barrier laminate is stuck, the amount of water in the device may not be zero, but the water is present therein though the amount may be small. Due to the water concentration gradient, the water diffuses and migrates into the water barrier laminate where the water concentration is smaller and is absorbed by the first water-trapping layer. Here, if the water absorbed by the first water-trapping layer remains blocked in the first water-trapping layer, then the absorbed water causes the water concentration in the first water-trapping layer to increase in short periods of time and, therefore, the water concentration gradation with respect to the device side is decreased. As a result, the first water-trapping layer shows decreased performance.

On the other hand, when the water-permeable organic layer is thickly formed on the outer side of the first water-trapping layer (on the side opposite to the device) by adjusting the distance as described above, the water concentration increases less corresponding to an increment in the thickness. Therefore, the water migrates more to the side of the water-permeable organic layer. The water that has migrated to the side of the water-permeable organic layer permeates through the second water barrier layer and is absorbed by the second water barrier layer, thereby avoiding such an occurrence that the water is blocked in the first water-trapping layer. As a result, it is considered that the water concentration in the first water-trapping layer is effectively suppressed from rising, so that the first water-trapping layer is prevented from losing its performance in short periods of time and, therefore, excellent water-barrier property is exhibited for extended periods of time.

The water barrier laminate of the present invention can be used as a substrate or a sealing layer for a variety of kinds of devices that must not allow the infiltration of water, such as organic electroluminescent (organic EL) panels, touch panels and the like. The water barrier laminate of the invention can be particularly suitably used for the organic EL panels.

BRIEF DESCRIPTION OF THE DRAWINGS

FIGS. 7A and 7B are views illustrating a representative structure of a water-trapping layer.

MODES FOR CARRYING OUT THE INVENTION

Figure 1:
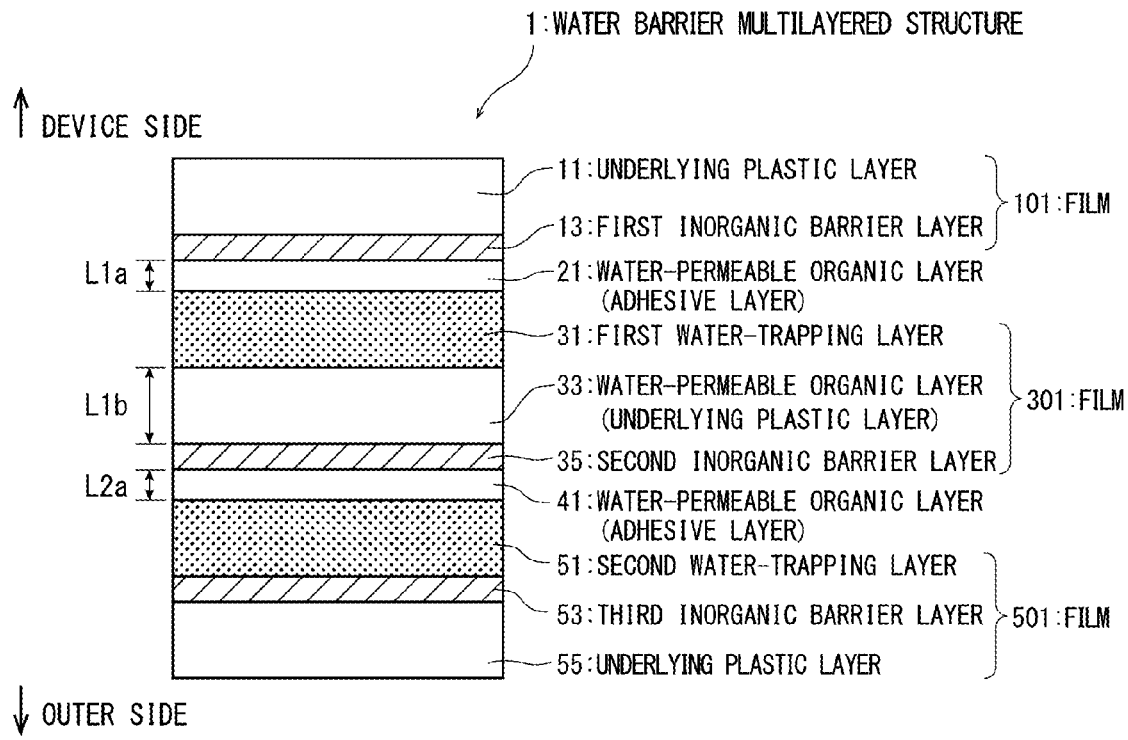
FIG. 1 is a view illustrating a representative structure of layers of a water barrier laminate of the present invention.

A basic structure of layers of the present invention will be described below with reference to FIG. 1. The water barrier multi-layered structure of the invention generally denoted by 1 has a basic structure of layers in which inorganic barrier layers and water-trapping layers are alternately arranged in the following order from the side facing the device (side of low-humidity atmosphere) to the outer side (side of high-humidity atmosphere): a first inorganic barrier layer 13, a first water-trapping layer 31, a second inorganic barrier layer 35, a second water-trapping layer 51 and a third inorganic barrier layer 53. A water-permeable underlying plastic layer 11 is located on the first inorganic barrier layer 13 on the side of the device.

Further, a water-permeable organic layer 21 is provided as an adhesive layer between the first inorganic barrier layer 13 and the firs water-barrier layer 31.

Moreover, a water-permeable organic layer 33 is located between the first water-trapping layer 31 and the second inorganic barrier layer 35. The water-permeable organic layer 33 serves as a plastic layer (i.e., water-permeable underlying plastic layer) under the second inorganic barrier layer 35.

Further, a water-permeable organic layer 41 is provided as an adhesive layer between the second inorganic barrier layer 35 and the second water-trapping layer 51.

A water-permeable underlying plastic layer 55 is provided on the outer side of the third inorganic barrier layer 53 (on the side opposite to the device).

<Plastic Layers that Lie Under the Inorganic Barrier Layers>

In the invention, the plastic layers that lie under the inorganic barrier layers, e.g., underlying plastic layers 11, 55 and water-permeable organic layers 33 and 41 in FIG. 1, are formed by using a thermoplastic or thermosetting resin known per se. by means of an injection or co-injection forming method, an extrusion or co-extrusion forming method, a film-forming or sheet-forming method, a compression forming method or a cast polymerization method depending on their forms. The thermoplastic or thermosetting resin is selected by taking into consideration the formability and cost thereof as well as properties that are required depending on the locations of the underlying plastic layers. Though not limited thereto, the thermoplastic or thermosetting resin is usually selected from those exemplified below.

Polyolefins or cyclic olefin copolymers such as random or block copolymers of α-olefins, like low-density polyethylene, high-density polyethylene, polypropylene, poly 1-butene, poly 4-methyl-1-pentene or ethylene, propylene, 1-butene and 4-methyl-1-pentene;

Ethylene-vinyl compound copolymers such as ethylene-vinyl acetate copolymer, ethylene-vinyl alcohol copolymer, and ethylene-vinyl chloride copolymer;

Styrene type resins such as polystyrene, acrylonitrile styrene copolymer, ABS, and α-methylstyrene-styrene copolymer;

Polyvinyl compounds such as polyvinyl chloride, polyvinylidene chloride, vinyl chloride-vinylidene chloride copolymer, methyl polyacrylate and methyl polymethacrylate;

Polyamides such as nylon 6, nylon 6-6, nylon 6-10, nylon 11 and nylon 12;

Thermoplastic polyesters such as polyethylene terephthalate (PET), polybutylene terephthalate and polyethylene naphthalate (PEN);

Polycarbonates, polyphenylene oxides, as well as polyimide resin, polyamideimide resin, polyetherimide resin, fluorine-contained resin, allyl resin, polyurethane resin, cellulose resin, polysulfone resin, polyethersulfone resin, ketone resin, amino resin and biodegradable resins such as polylactic acid, etc.; and Blends of the resins described above and those resins that are suitably modified by copolymerization (e.g., acid-modified olefin resins).

In the invention, the underlying plastic layers have a water permeability higher than that of the inorganic barrier layers that have a water permeability higher than that of the water-trapping layers. This enables the water in the device to be trapped by the first water-trapping layer 31 and, further, enables the water trapped by the first water-trapping layer 31 to be released to the outer side (toward the side opposite to the device). For example, the plastic layers under the inorganic barrier layers have a water permeability of not less than 1.0 g/m$^2$/day, preferably, not less than 5 g/m$^2$/day and, more preferably, not less than 10 g/m$^2$/day in an atmosphere of 40° C.90% RH.

Preferably, further, the underlying plastic layers can be formed by using a gas-barrier resin having excellent oxygen-barrier property, such as an ethylene-vinyl alcohol copolymer. Moreover, the underlying plastic layers may have a multi-layered structure including a layer formed by using such a gas-barrier resin.

In the present invention, unless any specific functions are required, it is, further, preferred to use, as the underlying plastic layers, a polyester resin as represented by polyethylene terephthalate (PET) or an olefin resin as represented by polyethylene and polypropylene from the standpoint of easy availability, cost, formability, some extent of barrier property against oxygen, and suitability for forming layers under the inorganic barrier layers that will be described later.

<Inorganic Barrier Layers>

The inorganic barrier layers of the invention have been known as taught in, for example, JP-A-2015-96320, and are the inorganic vapor-deposited films such as of various metals or metal oxides like silicon oxide films, silicon oxynitride films or aluminum oxide films that are formed by physical vapor deposition as represented by sputtering, vacuum evaporation or ion plating, or chemical vapor deposition as represented by plasma CVD. Specifically, these inorganic barrier layers are preferably vapor-deposited films formed by the chemical vapor deposition from such a standpoint that they are uniformly formed even on rugged surfaces, and they exhibit excellent barrier property not only against the water but also against oxygen and the like.

Further, the inorganic barrier layers formed by the coating method preferably can be the films formed by using a resin having a high water-vapor-barrier property, such as polyvinylidene chloride. Or the inorganic barrier layers preferably can be the films formed by applying, onto the predetermined surface, an organic solvent solution containing inorganic film-forming components such as polysilazane, polycondensing silane compound (e.g., alkoxysilane, etc.) or polycondensing alumina compound (e.g., alkoxyaluminum, etc.), which are suitably mixed with fine inorganic particles such as of silica or alumina, and heating the organic solvent solution to volatilize the organic solvent.

In FIG. 1, the first inorganic barrier layer 13 is formed by vacuum evaporation on the water-permeable underlying plastic layer 11.

The second inorganic barrier layer 35 is formed by vacuum evaporation on the water-permeable organic layer 33 that is serving as an underlying plastic layer.

The third inorganic barrier layer 53 is formed by vacuum evaporation on the water-permeable organic layer 55 that is serving as an underlying plastic layer.

That is, to deposit the film by the plasma CVD, the base material on which the inorganic barrier layer is to be formed is arranged in a plasma-treating chamber held at a predetermined degree of vacuum, and a gas (reaction gas) of a metal or a compound containing the metal for forming the film and an oxidizing gas (usually, oxygen or NOx gas) are fed together with a carrier gas such as argon, helium or the like gas, through a gas feed pipe, into the plasma-treating chamber that is shielded with a metal wall and is reduced to a predetermined degree of vacuum. In this state, a microwave electric field or a high-frequency electric field is applied to generate a glow discharge and, therefore, to generate a plasma by the electric energy thereof, so that the decomposed reaction product of the compound is deposited on the surface of the plastic base material to form a film thereof.

As the reaction gas, there is usually used a gas of an organometal compound from the standpoint of forming, on the interface of the underlying base material, a film having a flexible region containing carbon and a region of a high degree of oxidation and excellent barrier property on the above region. Namely, there is preferably used a gas of an organoaluminum compound such as trialkylaluminum or a gas of an organotitanium compound, organozirconium compound or organosilicon compound. Specifically, it is most desired to use a gas of the organosilicon compound from the standpoint of relatively easily and efficiently forming the inorganic barrier layer having a high degree of barrier property against oxygen in addition to barrier property against the water.

As the organosilicon compound, there can be used organosilane compounds such as hexamethyldisilane, vinyltrimethylsilane, methylsilane, dimethylsilane, trimethylsilane, diethylsilane, propylsilane, phenylsilane, methyltriethoxysilane, vinyltriethoxysilane, vinyltrimethoxysilane, tetramethoxysilane, tetraethoxysilane, phenyltrimethoxysilane, methyltrimethoxysilane and methyltriethoxysilane; and organosiloxane compounds such as octamethylcyclotetrasiloxane, 1,1,3,3-tetramethyldisiloxane and hexamethyldisiloxane. There can be, further, used aminosilane, silazane and the like.

The above organometal compounds can be used alone or in combination of two or more kinds.

From the standpoint of cost and handling, it is desired to use a gas of the aluminum oxide.

The thickness of the inorganic barrier layer may vary depending on the use of the water barrier laminate of the invention or the required level of barrier property, but is usually set so that properties of the base material that serves as the underlying layer during the vacuum evaporation are not impaired and that a water vapor permeability is maintained to be not more than $10^{-2}$ g/m$^2$·day/atm and, specifically, not more than $10^{-3}$ g/m$^2$·day/atm at 40° C.90% RH. Though dependent upon the ratio occupied by the above highly oxidized region, the thickness of the inorganic barrier layer should be usually 4 to 500 nm and, specifically, about 30 to about 400 nm. To assure the above-mentioned water vapor permeability, there may be overlapped a plurality of films having an inorganic barrier layer.

The inorganic barrier layer formed as described above has a water permeability of not more than 0.1 g/m$^2$/day, preferably, not more than 0.05 g/m$^2$/day and, more preferably, not more than 0.01 g/m$^2$/day. This is because if the water permeability is larger than the above range, the water cannot be shut off to a sufficient degree, and the water barrier laminate as a whole exhibits decreased performance.

Further, the above inorganic barrier layer may be constituted by two or more barrier layers. For instance, two or more inorganic barrier layers, each by itself failing to satisfy the required water permeability, may be laminated via an adhesive layer, so that the laminated layers as a whole work as a single inorganic barrier layer to assure performance of the water barrier laminate.

An anchor coating may be provided between the inorganic barrier layer and the water-trapping layer in order to improve adhesiveness.

As the resin such as thermosetting resin or thermoplastic resin for forming the anchor coating, there can be used either a solvent type resin or an aqueous resin. Concretely, there can be used polyester resin, urethane resin, acrylic resin, nitrocellulose resin, silicon resin, alcoholic hydroxyl group-containing resin (vinyl alcohol resin, ethylene vinyl alcohol resin, etc.), vinyl type modified resin, isocyanate group-containing resin, carbodiimide resin, alkoxysilyl group-containing resin, epoxy resin, oxazoline group-containing resin, modified styrene type resin, modified silicon type resin and alkyl titanate, and these resins can be used alone or in combination of two or more kinds.

<Water-Trapping Layers>

The water-trapping layers of the invention work to shut off the water that flows in the direction of thickness of the water barrier multilayered structure of the invention. Any known layers can be used without specific limitation as the water-trapping layer, provided they are capable of shutting off the water, such as those obtained by dispersing a physical desiccant like zeolite or silica gel or dispersing a chemical desiccant like calcium oxide in predetermined resin layers. Or the layers may be such known layers as non-ionic polymer layers having hygroscopic property like polyvinyl alcohol, water-soluble nylon or polyethylene oxide. When a particularly high barrier property is required against the water, there can be, desirably, used layers of a structure in which an ionic polymer disclosed, for example, in JP-A-2015-96320 serves as a matrix, and a hygroscopic agent is dispersed in the matrix, the hygroscopic agent having an ultimate humidity lower than that of the ionic polymer. By using such an ionic polymer as the matrix, the layer exhibits excellent water-trapping property yet effectively avoiding deformation such as swelling that is caused by water absorption.

FIGS. 7A and 7B show representative structures of the water-trapping layer when the above-mentioned ionic polymer is used as the matrix. FIG. 7A shows a water-trapping layer using, as the matrix, a cationic polymer having cationic groups (NH$_2$ groups, etc.) as the ionic groups while FIG. 7B shows a water-trapping layer using, as the matrix, an anionic polymer having anionic groups (COONa groups, COOH groups, etc.) as the ionic groups.

Namely, in the water-trapping layer that uses the above-mentioned ionic polymer as the matrix, a trace amount of water that has flowed through the inorganic barrier layer is absorbed by the matrix (ionic polymer). Since the matrix by itself absorbs the moisture to a high degree, the water-trapping layer traps and absorbs the water without permitting it to be released.

Here, if the water is simply absorbed by the matrix, then the absorbed water may be easily released due to a change in the environment such as a rise in temperature. Besides, as the water infiltrates, gaps among the polymer molecules forming the matrix might expand and, as a result, the water-trapping layer may swell.

However, when the hygroscopic agent is dispersed in the matrix, the hygroscopic agent having an ultimate humidity lower than that in the matrix (ionic polymer), the water absorbed in the matrix is, further, trapped by the hygroscopic agent that is more hygroscopic (i.e., has a lower ultimate humidity) than the matrix. Therefore, the water-trapping layer is effectively suppressed from being swollen by the absorbed water molecules. Besides, the water molecules are confined in the water-trapping layer. As a result, the water-trapping layer effectively prevents the water from being released.

As described above, when the water-trapping layer is formed by dispersing the hygroscopic agent in the ionic polymer, there are exhibited double functions, i.e., a high hygroscopic capability and the trapping and confinement of the water. This makes it possible to trap the water even in an atmosphere of a very low humidity and to trap the water at a rate sufficiently higher than a rate at which the water permeates through the inorganic barrier layer. Moreover, the layer as a whole traps the water without permitting it to be released to the exterior. Thus, a very high degree of water barrier property is realized.

Ionic Polymer (Cationic Polymer);

In the present invention, among the ionic polymers used for forming the above-mentioned matrixes, the cationic polymer is a polymer having in the molecules thereof cationic groups that could turn into a positive electric charge in water, such as primary to tertiary amino groups, quaternary ammonium groups, pyridyl groups, imidazole groups or quaternary pyridinium groups. The above cationic polymer contains the cationic groups that have a strong nucleophilic action, traps the water due to its hydrogen bond, and thus forms the matrix which is hygroscopic.

The amount of the cationic groups in the cationic polymer should be usually such that the water absorption (JIS K-7209-1984) of the hygroscopic matrix to be formed is not less than 20% and, specifically, 30% to 45% in an atmosphere of a humidity of 80% RH and 30° C.

As the cationic polymer, further, there is used the one that is obtained by polymerizing or copolymerizing, as appropriate, at least one kind of cationic monomers as represented by amine type monomers such as allylamine, ethyleneimine, vinylbenzyltrimethylamine, [4-(4-vinylphenyl)-methyl]-trimethylamine and vinylbenzyltriethylamine; nitrogen-containing heterocyclic monomers such as vinylpyridine and vinylimidazole; and salts thereof, together with other monomers copolymerizable therewith and, as required, partly neutralizing the formed polymer with an acid.

As the other monomers copolymerizable therewith, there can be exemplified styrene, vinyltoluene, vinylxylene, α-methylstyrene, vinylnaphthalene, α-halogenated styrenes, acrylonitrile, acrolein, methyl vinyl ketone, and vinylbiphenyl, though the present invention is not limited thereto.

Instead of using the above cationic monomers, it is also allowable to use a monomer having a functional group capable of introducing a cationic functional group, such as styrene, bromobutylstyrene, vinyltoluene, chloromethylstyrene, vinylpyridine, vinylimidazole, α-methylstyrene and vinylnaphthalene. After the polymerization thereof, the polymer thereof is subjected to the treatment such as amination or alkylation (chlorination with quaternary ammonium) to obtain a cationic polymer thereof.

In the invention, among the above-mentioned cationic polymers, the allylamine is particularly desired from the standpoint of film formability.

In the present invention, it is desired to introduce a crosslinked structure into the matrix that is formed by using the above-mentioned cationic polymer from the standpoint of maintaining a mechanical strength without lowering the hygroscopic capability and, at the same time, improving the dimensional stability.

That is, when the matrix absorbs the water, the crosslinked structure introduced into the hygroscopic matrix allows molecules of the cationic polymer to be locked by each other due to the crosslinking, and suppresses a change in the volume to be caused by swelling (absorption of water), bringing about an improvement in the mechanical strength and the dimensional stability.

The crosslinked structure can be introduced by adding a crosslinking agent to the coating composition for forming the water-trapping layer.

Ionic Polymer (Anionic Polymer);

In the present invention, the anionic polymer used for forming the hygroscopic matrix is a polymer that has in the molecules thereof an anionic functional group that could become a negative electric charge in water, such as carboxylic acid group, sulfonic acid group, phosphonic acid group, or acid base formed by partly neutralizing the above groups. The anionic polymer having such a functional group can form a hygroscopic matrix since the functional group traps the water based on the hydrogen bond.

The amount of the anionic functional groups in the anionic polymer, which depends on the kind of the functional groups, may be such that the water absorption (JIS K-7209-1984) of the hygroscopic matrix to be formed is not less than 20% and, specifically, 30% to 45% in an atmosphere of a humidity of 80% RH and 30° C., as described above for the cationic polymer.

As the anionic polymer having the above functional groups, there is used the one obtained by polymerizing or copolymerizing, as appropriate, at least one kind of an anionic monomer as represented by a carboxylic acid monomer such as methacrylic acid, acrylic acid, or anhydrous maleic acid; sulfonic acid monomer such as α-halogenated vinylsulfonic acid, styrenesulfonic acid or vinylsulfonic acid; phosphonic acid monomer such as vinylphosphoric acid; or salts of these monomers, together with other copolymerizable monomers and, as required, partly neutralizing the formed polymer by the treatment with an alkali.

As the other copolymerizable monomers, there can be exemplified styrene, vinyltoluene, vinylxylene, α-methylstyrene, vinylnaphthalene, α-halogenated styrenes, acrylonitrile, acrolein, methyl vinyl ketone and vinylbiphenyl, though the present invention is not limited thereto.

It is also allowable to obtain the anionic polymer by using an ester of the above anionic monomer or a monomer having a functional group capable of introducing an anionic functional group, such as styrene, vinyltoluene, vinylxylene, α-methylstyrene, vinylnaphthalene or α-halogenated styrenes instead of using the above-mentioned anionic monomer. After the polymerization thereof, the polymer thereof is subjected to such a treatment as hydrolysis, sulfonation, chlorosulfonation, or phosphoniation.

The anionic polymer preferably used in the present invention is a poly(meth)acrylic acid or a partly neutralized product thereof (e.g., a product thereof which is partly an Na salt).

In the present invention, it is particularly desired that a crosslinked structure is also introduced into the hygroscopic matrix formed by using the above anionic polymer from the standpoint of further improving the water-trapping capability of the water-trapping layer and further improving the dimensional stability.

That is, in the case of the anionic polymer, unlike the case of the cationic polymer, the water is trapped by only the hydrogen bond. By introducing a spatial mesh structure (crosslinked structure) adapted to absorbing moisture, therefore, the hygroscopic capability can be greatly improved. Such a crosslinked structure has a hydrophobic portion like that of the alicyclic structure in the mesh structure thereof, and enables the hydrophilic portion to exhibit further improved hygroscopic effect.

Moreover, with the crosslinked structure being introduced into the hygroscopic matrix, molecules of the anionic polymer are locked by each other due to the crosslinking when the matrix has absorbed the water. This suppresses a change in the volume to be caused by swelling (absorption of water) and brings about an improvement in the dimensional stability. The effect of improving the dimensional stability is the same as that of the case of the cationic polymer described above.

As in the case of the cationic polymer, the above crosslinked structure can be introduced by adding a crosslinking agent to the coating composition that forms the water-trapping layer.

Hygroscopic Agent;

The hygroscopic agent is dispersed in the water-trapping layer that uses the above ionic polymer as the matrix. The hygroscopic agent has an ultimate humidity lower than that of the ionic polymer (cationic polymer or anionic polymer) that forms the matrix and, therefore, exhibits a very high hygroscopic capability. Namely, the hygroscopic agent which is more hygroscopic than the matrix is dispersed. Therefore, the water absorbed by the matrix formed by the above-mentioned ionic polymer is readily trapped by the hygroscopic agent; i.e., the absorbed water is effectively confined within the matrix. Accordingly, the water-trapping layer effectively exhibits its capability of absorbing the water even in an atmosphere of a very low humidity and, besides, is effectively suppressed from swelling despite its water absorption.

As the hygroscopic agent that is highly hygroscopic as described above, there can be preferably used the one that has an ultimate humidity of not higher than 6% in an environment of a humidity of 80% RH and a temperature of 30° C. provided that it has an ultimate humidity lower than that of the ionic polymer as demonstrated, for example, in Examples appearing later. If the ultimate humidity of the hygroscopic agent is higher than that of the ionic polymer, then the water absorbed by the matrix cannot be confined to a sufficient degree but tends to be released, and thus it is impossible to greatly improve the water barrier property. Further, even if the ultimate humidity is lower than that of the ionic polymer, the water in an atmosphere of a low humidity cannot be trapped to a sufficient degree when the ultimate humidity measured under the above condition is higher than the above range. In this case, the water barrier property may not be exhibited to a sufficient degree.

The above hygroscopic agent usually has a water absorption (JIS K-7209-1984) of not less than 50% in an environment of a humidity of 80% RH and a temperature of 30° C., and is either inorganic or organic.

As the inorganic hygroscopic agent, there can be exemplified clay minerals such as zeolite, alumina, activated charcoal and montmorillonite, as well as silica gel, calcium oxide and magnesium sulfate.

As the organic hygroscopic agent, there can be exemplified an anionic polymer or a crosslinked product of a partly neutralized product thereof. As the anionic polymer, there can be exemplified the one obtained by polymerizing at least one of the anionic monomers represented by carboxylic acid monomers ((meth)acrylic acid, anhydrous maleic acid, etc.), sulfonic acid monomers (halogenated vinyl sulfonate, styrenesulfonic acid, vinyl sulfonate, etc.), phosphonic acid monomers (vinylphosphoric acid, etc.) or salts of these monomers, or copolymerizing it with other monomers. Specifically, in the use where transparency is required, an organic hygroscopic agent is effectively used. For instance, fine particles of a crosslinked sodium poly(meth)acrylate can be representatively used as the organic hygroscopic agent.

In the invention, it is desired to use a hygroscopic agent having a small particle size (e.g., average primary particle size of not more than 100 nm and, specifically, not more than 80 nm) from the standpoint of attaining a large specific surface area and high hygroscopic property. Particularly, it is most suitable to use a hygroscopic agent of an organic polymer having a small particle size.

That is, the hygroscopic agent of the organic polymer is dispersed very well, i.e., dispersed homogeneously, in the matrix of the ionic polymer. Besides, by employing an emulsion polymerization or a suspension polymerization as a polymerization method for the production thereof, it is possible to obtain the hygroscopic agent having a fine and uniformly spherical particle shape. By adding the hygroscopic agent of the organic polymer in not less than a certain amount, it is made possible to realize a very high degree of transparency.

Further, the organic fine hygroscopic agent has a very low ultimate humidity, has a high hygroscopic property, and causes very little change in the volume to be caused by swelling due to the crosslinking. Therefore, it is suitable for lowering the humidity so that the environmental atmosphere reaches the absolutely dry state or close to the absolutely dry state, while suppressing a change in the volume.

As fine particles of the organic hygroscopic agent, there have been placed in the market, for example, fine particles of crosslinked Na polyacrylate (average particle size of about 70 nm) in the form of a colloidal dispersion solution (pH=10.4) under the trade name of TAFTIC HU-820E by Toyobo Co.

In the present invention, the amount of the hygroscopic agent is determined depending on the kind of the ionic polymer from the standpoint of exhibiting its properties to a sufficient degree, greatly improving the water barrier property, effectively suppressing a change in the size to be caused by swelling, and maintaining the water barrier property higher than the water barrier property of the inorganic barrier layer over extended periods of time.

For instance, in the case of the water-trapping layer in which the above ionic polymer is used as the matrix and the hygroscopic agent is dispersed in the matrix, in a use where particularly high water barrier property is required, the water-trapping layer is formed in a thickness (e.g., not less than 1 μm and, specifically, about 2 to about 20 μm) large enough to exhibit such a super-barrier property that the water vapor permeability is not more than $10^{-5}$ g/m$^2$/day. When the matrix is formed by using the cationic polymer, the hygroscopic agent is used in an amount of not less than 50 parts by mass, specifically, in an amount of 100 to 900 parts by mass and, more preferably, in an amount of 200 to 600 parts by mass per 100 parts by mass of the ionic polymer in the water-trapping layer. Further, when the matrix is formed by using the anionic polymer, the hygroscopic agent is used in an amount of not less than 50 parts by mass, specifically, in an amount of 100 to 1300 parts by mass and, more preferably, in an amount of 150 to 1200 parts by mass per 100 parts by mass of the anionic polymer in the water-trapping layer.

Forming the Water-Trapping Layer;

Further, the above-mentioned water-trapping layer can be formed by using a coating composition that is prepared by dispersing the hygroscopic agent in the ionic polymer that serves as the matrix and, as required, by using a predetermined solvent in which a crosslinking agent is dissolved. The coating composition is then applied and dried to remove the solvent. After the film is formed, the water-trapping layer must be held in a dry atmosphere of a reduced pressure, so that the water contained in the layer is released. This is because if the multilayered structure is prepared in a state where the water still remains in the water-trapping layer, the water content could reach the saturated state in short periods of time.

Referring to FIG. 1, the first water-trapping layer 31 is formed by applying the coating composition onto the water-permeable organic layer 33 that is formed as the underlying plastic layer.

Further, the second water-trapping layer 51 is formed by applying the coating composition onto the third inorganic barrier layer 53.

The coating composition for forming the water-trapping layer, which has been described in JP-A-2015-96320, may be slightly different between the case where the matrix is formed by using the cationic polymer (hereinafter simply called "cationic matrix") and the case where the matrix is formed by using the anionic polymer (hereinafter simply called "anionic matrix").

In the case of the cationic matrix;

The coating composition contains the cationic polymer and the hygroscopic agent at the above-mentioned ratio. Namely, the hygroscopic agent is contained in the coating composition in the amount mentioned above per 100 parts by mass of the cationic polymer.

Moreover, a siloxane structure or a polyalicyclic structure, for example, can be introduced into the crosslinked structure by using a crosslinking agent for introducing the crosslinked structure into the hygroscopic matrix of the cationic polymer. A spatial mesh structure adapted to absorbing the moisture can be thus formed.

As the crosslinking agent in this case, there can be used a compound having a crosslinking functional group (e.g., epoxy group) capable of reacting with the cationic group and a functional group (e.g., alkoxysilyl group) capable of forming a siloxane structure in the crosslinked structure through the hydrolysis and through the dehydrating condensation. As the crosslinking agent, specifically, there can be favorably used a silane compound represented by the following formula (4):

$$X-SiR^1_n(OR^2)_{3-n} \tag{4}$$

wherein X is an organic group having an epoxy group at the terminal thereof, $R^1$ and $R^2$ are, independently, methyl groups, ethyl groups or isopropyl groups, and n is 0, 1 or 2.

The above silane compound has an epoxy group and an alkoxysilyl group as functional groups, and the epoxy group undergoes the addition reaction with a functional group (e.g., $NH_2$) of the cationic polymer. On the other hand, the alkoxysilyl group forms a silanol group (SiOH group) through the hydrolysis, and grows by forming the siloxane structure through the condensation reaction to finally form a crosslinked structure among the cationic polymer chains. The crosslinked structure having the siloxane structure is thus introduced into the matrix of the cationic polymer.

Besides, the coating composition contains the cationic polymer and is alkaline, thereby accelerating the addition reaction of the cationic group with the epoxy group or the dehydration-condensation among the silanol groups.

In the invention, the organic group X having the epoxy group in the above formula (4) can be represented by a γ-glycidoxyalkyl group. For instance, γ-glycidoxypropyltrimethoxysilane and γ-glycidoxypropylmethyldimethoxysilane can be favorably used as crosslinking agents.

Further, the compound of the above formula (4) in which the epoxy group is an alicyclic epoxy group such as epoxycyclohexyl group, too, can be favorably used as the crosslinking agent. For instance, when a compound having an alicyclic epoxy group such as β-(3,4-epoxycyclohexyl) ethyltrimethoxysilane is used as the crosslinking agent, the siloxane structure as well as the alicyclic structure can be introduced into the crosslinked structure of the matrix. Introduction of the alicyclic structure helps more effectively to realize the function of the matrix which is to form the spatial mesh structure adapted to absorbing the moisture.

To introduce the alicyclic structure into the crosslinked structure, there can be used, as the crosslinking agent, a compound having a plurality of epoxy groups and alicyclic groups, e.g., a diglycidyl ester represented by, for example, the following formula (5):

$$G-O(C=O)-A-(C=O)O-G \tag{5}$$

wherein G is a glycidyl group, and

A is a divalent hydrocarbon group having an aliphatic ring, such as cycloalkylene group.

Representative examples of the diglycidyl ester are expressed by the following formula (5-1).

[Chemical 1]

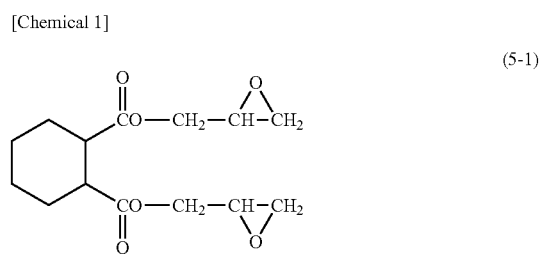

(5-1)

The diglycidyl ester of the formula (5) has no alkoxysilyl group but works to introduce the alicyclic structure into the crosslinked structure, and is effective from the standpoint of forming, in the matrix, a spatial mesh structure that is adapted to absorbing the moisture.

In the coating composition forming the cationic matrix, it is desired that the crosslinking agent is used in an amount of 5 to 60 parts by mass and, specifically, 15 to 50 parts by mass per 100 parts by mass of the cationic polymer and that at least not less than 70% by mass and, preferably, not less than 80% by mass of the crosslinking agent is the silane compound of the formula (4) described above.

When the crosslinking agent is used in too large amounts, the matrix becomes brittle in terms of the mechanical strength and less easy to handle. When prepared in the form of a coating material, the composition quickly becomes so viscous that a sufficiently long pot life cannot be guaranteed. When the crosslinking agent is used in too small amounts, on the other hand, it may become difficult to maintain the resistance (e.g., mechanical strength) in severe environments (e.g., under highly humid conditions).

Any solvent can be used without limitation for the coating composition that contains the above-mentioned components, provided it can be volatilized and removed upon being heated at a relatively low temperature. For instance, there can be used an alcoholic solvent such as methanol, ethanol, propyl alcohol or butanol; a ketone solvent such as acetone or methyl ethyl ketone; a mixed solvent of the above solvents and water; or an aromatic hydrocarbon solvent such as water, benzene, toluene or xylene. Specifically, it is desired to use the water or a mixed solvent containing the water to accelerate the hydrolysis of the silane compound having an alkoxysilyl group in the crosslinking agent in the coating composition.

The above solvent is used in such an amount that the coating composition assumes a viscosity suited for being applied. Here, however, it is also allowable to add a nonionic polymer in a suitable amount to adjust the viscosity of the coating composition or to adjust the water absorption of the formed hygroscopic matrix to lie in a suitable range.

As the non-ionic polymer, there can be exemplified saturated aliphatic hydrocarbon polymers such as polyvinyl alcohol, ethylene-propylene copolymer and polybutylene; styrene type polymers such as styrene-butadiene copolymer, etc.; polyvinyl chloride; and those obtained by copolymerizing the above polymers with various comonomers (e.g., styrene type monomers such as vinyltoluene, vinylxylene, chlorostyrene, chloromethylstyrene, α-methylstyrene, α-halogenated styrene and α, β, β'-trihalogenated styrene; monoolefins such as ethylene and butylene; or conjugated diolefins such as butadiene and isoprene).

In the case of the anionic matrix;

The coating composition for forming the water-trapping layer, in this case, contains the anionic polymer and the hygroscopic agent in such a manner that the amount of the hygroscopic agent lies in the above-mentioned range per 100 parts by mass of the anionic polymer.

The coating composition in this case, too, is suitably blended with the crosslinking agent like in the case of the above-mentioned cationic matrix.

As the crosslinking agent, there can be used a compound having two or more crosslinking functional groups (e.g., epoxy groups) capable of reacting with the ionic groups possessed by the anionic polymer. Namely, there can be desirably used a diglycidyl ester represented by the formula (5):

G-O(C=O)-A-(C=O)O-G    (5)

wherein G is a glycidyl group, and

A is a divalent hydrocarbon group having an aliphatic ring, such as cycloalkylene group, which was also presented for the coating composition for forming the cationic matrix.

In the diglycidyl ester of the above formula (5), the epoxy group reacts with the anionic group, and a crosslinked structure that includes an alicyclic structure due to the divalent group A is formed in the matrix. The crosslinked structure that includes the alicyclic structure suppresses the layer from swelling.

Among the above diglycidyl esters, preferred examples have already been quoted above, and the most desired example is a diglycidyl ester represented by the above formula (5-1) from the standpoint of forming the spatial mesh structure adapted to absorbing the moisture.

It is desired that the coating composition for forming the anionic matrix contains the crosslinking agent in an amount of 1 to 50 parts by mass and, specifically, 10 to 40 parts by mass per 100 parts by mass of the anionic polymer. When the crosslinking agent is used in too large amounts, the matrix becomes brittle in terms of the mechanical strength and less easy to handle. When prepared in the form of a coating material, the composition quickly becomes so viscous that a sufficiently long pot life cannot be guaranteed. When the crosslinking agent is used in too small amounts, on the other hand, it may become difficult to maintain the resistance (e.g., mechanical strength) in severe environments (e.g., under highly humid conditions).

Any solvent can be used without limitation for the coating composition that contains the above-mentioned components, provided it can be volatilized and removed upon being heated at a relatively low temperature. For instance, there can be used those that were exemplified for the coating composition for forming the cationic matrix.

Further, the coating composition for forming the anionic matrix can be added with an alkali (e.g., sodium hydroxide or the like) to adjust the pH. For instance, the alkali can be so added that the pH becomes about 8 to about 12.

Like in the case of the coating composition for forming the cationic matrix, the solvent is used in such an amount that the coating composition acquires a viscosity suited for being applied. Moreover, the above-mentioned non-ionic polymer can be added in a suitable amount in order to adjust the viscosity of the coating composition or to adjust the water absorption of the hygroscopic matrix to be formed so that it lies in a suitable range.

A film is formed by using the coating composition for forming the cationic matrix or the anionic matrix. Namely, the coating composition is applied onto the first inorganic barrier layer 13 and is heated to a temperature of about 80 to about 160° C. The heating time is usually from several seconds to several minutes though it varies depending on the ability of the heating device such as heating oven. By heating, the solvent is removed and, besides, the crosslinking agent reacts with the ionic polymer to form the water-trapping layer that has the crosslinked structure introduced into the matrix.

<Water-Permeable Organic Layer>

In the invention, the water-permeable organic layer stands for an organic layer having a water permeability higher than that of the inorganic barrier layer. That is, as described above in the item of the underlying plastic layer, the organic layer has a water permeability of not less than 1.0 g/m²/day, preferably, not less than 5 g/m²/day and, more preferably, not less than 10 g/m²/day.

Basically, the water-permeable organic layer is formed as an underlying plastic layer or an adhesive layer. Not only being limited thereto, however, the water-permeable organic layer should, in principle, be a functional layer formed of a material that exhibits functions other than the water-trapping property (or the water barrier property). For example, in order that the water-trapping layer is not formed neighboring the inorganic barrier layer, there may be formed another layer between them. That is, between the water-trapping layer and the inorganic barrier layer, there can be formed the layer which may be a buffer layer for relaxing a change in the volume that is caused when the water-trapping layer swells by absorbing moisture, a protective resin layer for preventing the loss of activity that is caused when the water-trapping layer absorbs the moisture during the step of production, a layer having a function to smooth the surface for forming the barrier layer, or an organic layer (adhesion-improving layer) to which an inorganic filler or a silane compound has been added to improve barrier property and adhesiveness to the inorganic layer.

Between the water-permeable organic layer and the water-trapping layer, there may be formed an anchor coating in order to improve the adhesiveness. As the resin for forming the anchor coating, the resins already exemplified for the anchor coating to be formed between the inorganic barrier layer and the water-trapping layer can be used alone or in combination of two or more kinds.

In the case of the underlying plastic layer;

The water-permeable organic layer is formed as the underlying plastic layer by using a thermoplastic or thermosetting resin that is known per se. As the thermoplastic or thermosetting resin, there can be used those exemplified as the resins for forming the water-permeable underlying plastic layer.

Desirably, further, the water-permeable organic layer is formed as the underlying plastic layer by using a gas-barrier resin having excellent oxygen-barrier property, such as ethylene-vinyl alcohol copolymer. It may, further, assume a multilayered structure that includes a layer formed by using such a gas-barrier resin.

In the invention, it is more desired to use a polyester resin as represented by polyethylene terephthalate (PET) or an olefin resin as represented by polyethylene or polypropylene from the standpoints of easy availability, cost, formability, some extent of barrier property against oxygen and adaptability as a layer to be formed under the inorganic barrier layer.

In FIG. 1, the second inorganic barrier layer 35 is formed by vacuum evaporation on the surface of the water-permeable organic layer 33 on the outer side thereof (on the side opposite to the device). Thus the water-permeable organic layer 33 serves as the plastic resin layer under the second inorganic barrier layer 35.

In the case of the adhesive layer;

To form a water-permeable organic layer that works as the adhesive layer, there can be used pressure-sensitive adhesives or those known as the so-called dry laminate adhesives obtained by dissolving or dispersing an adhesive resin in an organic solvent, such as urethane adhesive, polyester adhesive, polyether adhesive, epoxy adhesive and acrylic adhesive. In the present invention, it is desired to use the urethane adhesive and epoxy adhesive which are the dry laminate adhesives from the standpoints of low saturation coefficient of moisture absorption and relatively high water barrier property.

The above-mentioned urethane adhesive contains a polyol and a polyisocyanate as resin components.

As the polyol component, there can be used diols such as ethylene glycol, propylene glycol, 1,4-butane diol, diethylene glycol, 1,6-hexylene glycol, cyclohexane dimethanol and ethylene oxide adduct of bisphenol A, and at least one of those alcohols having a valence of three or more, such as trimethylolmethane, trimethylolethane, trimethylolpropane and pentaerythritol, though the present invention is not limited thereto. Polyester polyol, hydroxyl group-containing acrylate (e.g., pentaerythritol triacrylate, etc.) and the like can also be used as the polyol components.

As the polyisocyanate, there can be used diphenylmethanediisocyanate (MDI), tolylenediisocyanate (TDI), hexamethylenediisocyanate (HDI), metaxylylenediisocyanate, tetramethylenediisocyanate, pentamethylenediisocyanate, lyzineisocyanate, isophoronediisocyanate (IPDI) and at least one of polynucleic condensates of these isocyanates, though the present invention is not limited thereto.

The above polyisocyanate may have its terminals blocked with a blocking agent such as alcohol like methanol, ethanol or lactic acid ester; phenolic hydroxyl group-containing compound like phenol or salicylic acid ester; amide like ε-caprolactam or 2-pyrrolidone; oxime like acetone oxime or methyl ethyl ketone oxime; or active methylene compound like methyl acetoacetate, ethyl acetoacetate, acetylacetone, dimethyl malonate and diethyl malonate.

The above epoxy adhesive, desirably, contains at least two epoxy groups in the molecules thereof. As such a resin, there can be exemplified aliphatic glycidyl ether, glycidyl ether of the bisphenol A type, AD type, S type or F type, glycidyl ether of the hydrogenated bisphenol A type, glycidyl ether of the ethylene oxide adduct bisphenol A type, glycidyl ether of the propylene oxide adduct bisphenol A type, glycidyl ether of phenol novolac resin, glycidyl ether of cresol novolac resin, glycidyl ether of bisphenol A novolac resin, glycidyl ether of naphthalene resin, trifunctional (or tetrafunctional) glycidyl ether, glycidyl ether of dicyclopentadienephenol resin, diglycidyl ether of diallylbisphenol A, polycondensate of allylated bisphenol A and epichlorohydrin, glycidyl ester of dimeric acid, trifunctional (or tetrafunctional) glycidylamine, and glycidylamine of naphthalene resin. These resins can be used alone or in combination of two or more kinds. As the curing agent for the above epoxy resins, there can be used, for example, polyurethane at the terminal of the amino groups, phenolic compound, aliphatic amine, alicyclic amine, aromatic polyamine, polyamide, aliphatic acid anhydride, alicyclic acid anhydride, aromatic acid anhydride, dicyandiamide, organic acid dihydrazide, amine boron trifluoride complex, imidazoles and tertiary amine, which can be used alone or in combination of two or more kinds.

As the pressure-sensitive adhesive, there can be used, for example, at least one selected from acrylic resin, epoxy resin, epoxy group-containing acrylic copolymer, phenolic resin, epoxy resin curing agent, isobutylene resin and epoxy thermosetting resin of a half-cured state comprising the epoxy resin curing agent.

Referring to FIG. 1, an adhesive is applied onto the first water-trapping layer 31. After drying, the first water-trapping layer 31 is press-adhered onto the first inorganic barrier layer 13 to thereby form the water-permeable organic layer 21. That is, the water-permeable organic layer 21 serves as an adhesive layer.

Further, an adhesive is applied onto the second water-trapping layer 51. After drying, the second water-trapping layer 51 is press-adhered onto the second inorganic barrier layer 35 to thereby form the water-permeable organic layer 41. That is, the water-permeable organic layer 41 serves as an adhesive layer.

<Other Layer Structures>

In the invention, so far as the above-mentioned basic layer structure is secured, other layers may be laminated on the surfaces of the device side and the outer side (side opposite to the device) to form further multilayered structures and, therefore, to further improve the water barrier property. For example, a multilayered structure including a further water-trapping layer is formed on the surface on the outer side, so that the water absorbed from the device is transferred from the first water-trapping layer to the second water-trapping layer and, further, to the outer side. This enables the first water-trapping layer to maintain its effect for more extended periods of time. It is, further, possible to form an auxiliary water-trapping layer on the device side so as to absorb the water permeating from the side surfaces thereof to prevent the loss of activity of the device.

<Forming the Water Barrier Laminate>

The water barrier laminate 1 shown in FIG. 1 is formed, for example, as described below.

To begin with, the first inorganic barrier layer 13 is formed on one surface of the underlying plastic layer 11 to thereby form a film 101.

Next, the second inorganic barrier layer 35 is formed on one surface of the water-permeable organic layer 33 that serves as the underlying plastic layer, and the water-trapping layer 31 is formed on the other surface thereof to thereby form a film 301.

Subsequently, the third inorganic barrier layer 53 is formed on one surface of the water-permeable organic layer 55 that serves as the underlying plastic layer, and the water-trapping layer 51 is formed on the thus formed inorganic layer to thereby form a film 501.

The surface of the film 101 on the side of the inorganic barrier layer 13 is adhered to the surface of the film 301 on the side of the water-trapping layer 31 with the water-permeable organic layer 21 that serves as the adhesive layer.

Finally, the surface of the film 301 on the side of the inorganic barrier layer 35 is adhered to the surface of the film 501 on the side of the water-trapping layer 51 with the water-permeable organic layer 41 that serves as the adhesive layer. Thus, the water barrier laminate 1 is obtained.

<Distances Among the Layers>

A distance L1a between the first water-trapping layer and the first inorganic barrier layer, and a distance L2a between the second water-trapping layer and the second barrier layer satisfy the conditions represented by the following formulas (1) and (2):

$$L1a < 3 \ \mu m \quad (1)$$

$$L2a < 3 \ \mu m \quad (2)$$

and a distance L1b between the second inorganic barrier layer and the first water-trapping layer is set to satisfy the condition represented by the following formula (3):

$$L1b \geq 3 \ \mu m \quad (3)$$

by interposing a water-permeable organic layer between these two layers.

In FIG. 1, the thickness of the water-permeable organic layer 21 formed as the adhesive layer corresponds to L1a.

The thickness of the water-permeable organic layer 41 formed as the adhesive layer corresponds to L2a.

Further, the thickness of the water-permeable organic layer 33 formed as the underlying plastic layer corresponds to L1b.

When the inorganic barrier layer is constituted by two or more barrier layers, the above-mentioned formulas (1) to (3) must be satisfied by the distances between the water-trapping layers and the inorganic barrier layers closest to the water-trapping layers.

The distances L1a and L2a are, preferably, less than 2.5 μm and, more preferably, less than 2 μm. That is, when the distances L1a and L2a are larger than the above-mentioned ranges, the barrier laminate possesses a decreased capability for trapping the water that permeates through.

Figure 2:
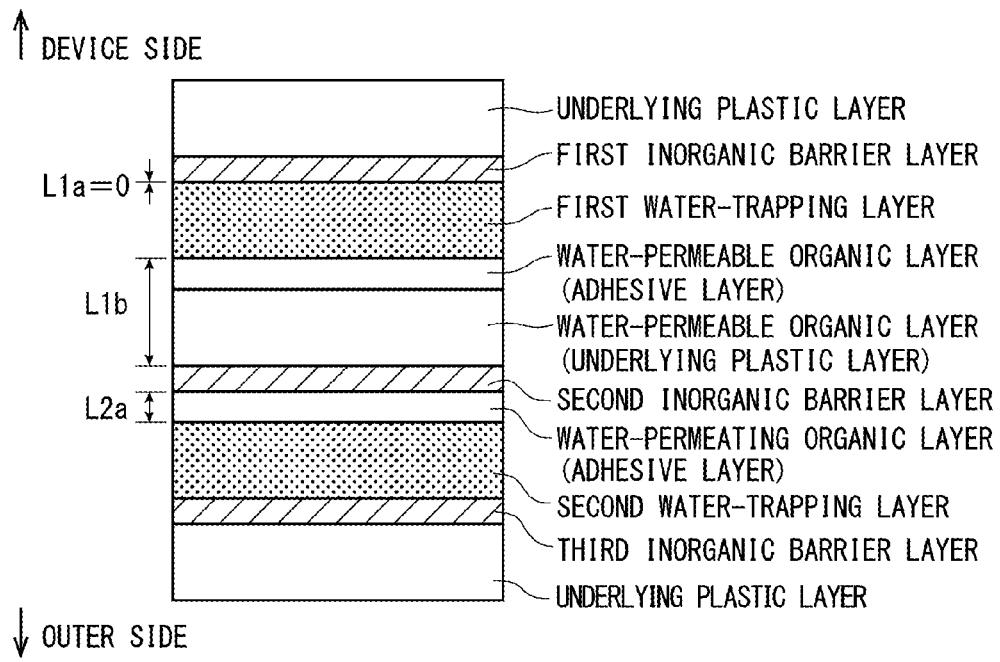
FIG. 2 is a view illustrating another structure of layers of the water barrier laminate of the present invention.
Figure 3:
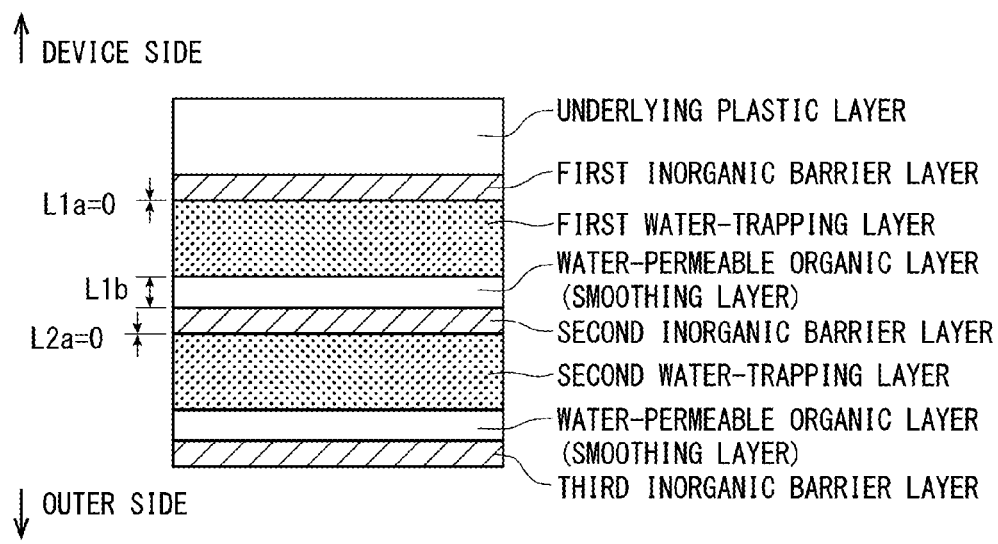
FIG. 3 is a view illustrating a further structure of layers of the water barrier laminate of the present invention.

FIG. 2 illustrates a constitution in which the first water-trapping layer and the second inorganic barrier layer come into direct contact with each other. In this case, the distance L1a is 0 μm. FIG. 3 illustrates a constitution in which, on the first water-trapping layer, there are a smoothing layer as the water-permeable organic layer, a second inorganic barrier layer, a second water-trapping layer, a smoothing layer as the water-permeable organic layer, and a third inorganic barrier layer formed in the order mentioned. In this case, the distance L1a is 0 μm and the distance L2a is 0 μm.

The distance L1b is, preferably, not less than 5 μm and, more preferably, not less than 10 μm. That is, if the distance L1b is smaller than the above range, the permeated water is transferred less to the outer side (opposite to the device) but is trapped in the first water-trapping layer. Therefore, the gradient of water concentration decreases between the first water-trapping layer and the inside of the device, and less water permeates through from the interior of the device. As a result, the first water-trapping layer exhibits decreased performance.

Further, the distance L1b is, preferably, not more than 45 μm and, more preferably, not more than 40 μm. That is, if the distance L1b becomes larger than the above range, then the influence of the water that flows in through the end surfaces of the layers constituting the distance L1b overwhelms the effect of preventing a drop of performance of the first water-trapping layer that is attained by transferring the permeated water toward the outer side of the device. Therefore, the water-trapping performance extinguishes in short periods of time.

The distances L1a, L2a and L1b can be adjusted to desired values by adjusting the thicknesses of the water-permeable organic layers or the like.

<Adhesive>

Usually, the water barrier laminate of the present invention is used being stuck to the devices or the like with an adhesive. This is preferred from the standpoint of reliably preventing undesired removal during the storage and transport.

When the adhesive is used, an adhesive layer is formed between the device and the water-permeable underlying plastic layer. Here, the adhesive layer (not shown in FIG. 1) shall not impair the hygroscopic property and, therefore, should have a water permeability higher than that of the water-permeable underlying plastic layer. For instance, the adhesive layer must have a water permeability at 40° C. and 90% RH of not less than 40 g/m²·day and, specifically, not less than 60 g/m²·day.

As the adhesive, there can be used a known adhesive such as (meth)acrylic adhesive, urethane adhesive and the like. By using such adhesives, the adhesive layer may be formed in a thickness that is not larger than a predetermined value (e.g., not larger than 30 μm) so as to secure the water permeability mentioned above.

Moreover, ethylene-vinyl acetate copolymer (EVA), soft polyolefin (LLDPE) and metallocene polyolefin elastomer can be also used as the adhesive.

<Use>

The water barrier multilayered structure of the present invention can be favorably used as a film for sealing electronic circuits of a variety of kinds of devices such as organic EL devices, solar cells, and e-papers. Namely, the water barrier multilayered structure is fitted to various kinds of devices in such a manner that the water-permeable underlying plastic layer is located on the side closer to the device (on the side of the low-humidity atmosphere) so as to exhibit its excellent water barrier property and to effectively prevent the leakage of electric charge to be caused by the water. The water barrier multilayered structure of the invention can be used, for example, for the protection of organic EL or light-emitting devices and photovoltaic power generating devices in the solar cells.

EXAMPLES

Excellent properties of the water barrier multilayered structure of the invention will now be described by way of Experimental Examples.

Measuring the Initial Water Vapor Permeability (g/m²/day);

By using a highly sensitive water vapor permeation measuring instrument (DELTAPERM manufactured by Technolox Co.), the water barrier multilayered structure was measured for its water vapor permeability by creating a pressure of water vapor that corresponded to 85° C.85% RH on both sides of the samples.

Sustenance of the Trapping Performance;

The water-trapping performance was evaluated by calculating the time until the trapping performance was lost (until the water vapor permeability became one-tenth of its initial value) on the basis of a change in the measured water vapor permeability in the above-mentioned environment of 85° C.85%. The shorter the time, the more quickly the water-trapping performance is lost. The longer the time, on the other hand, the longer the water-trapping performance lasts.

X: The trapping performance was lost in less than 50 hours.

◯: The trapping performance was lost in not less than 50 hours but in less than 200 hours.

◉: The trapping performance was lost in not less than 200 hours.

Effect of Removing the Water from the Sealing Resin;

By using a vacuum evaporation apparatus (JEE-400 manufactured by Nihon Denshi Co.), a sample was prepared by forming a thin Ca film (thin film of a metal that corrodes with water) of a thickness of 300 nm on a glass plate (5 cm×5 cm, thickness: 0.7 mm) by vacuum evaporation. The sample was transferred into a gloved box so that it was not exposed to the atmosphere.

The thin Ca film was formed in a square shape of 1 cm×1 cm at a single site by vacuum evaporation via a predetermined mask by using metal calcium as a source of evaporation.

In the gloved box, the thus formed sample was stuck to the surface of the water barrier laminate on the side of the device by using a commercially available acrylic PSA (thickness: 30 μm) as the sealing resin.

The thus fabricated unit for evaluation was stored in a constant temperature and humidity bath adjusted to an atmosphere of 85° C.0%. Thereafter, by using a laser microscope (laser scan microscope manufactured by Carl Zeiss Co.), the thin Ca film was observed for its state of corrosion due to the residual water released from the sealing resin. The effect of removing the water from the sealing resin was evaluated on the following basis.

X: The thin calcium film was corroded within 50 hours (no effect of removing the water).

Δ: The thin calcium film was corroded in 50 to 200 hours.

◯: The thin calcium film was not corroded even after the elapse of 200 hours.

Preparation of a polyethylene terephthalate (PET) film coated with an inorganic barrier layer;

By using a plasma CVD apparatus, an inorganic barrier layer of silicon oxide was formed on one surface of a biaxially stretched PET film of a thickness of 50 μm. Described below are the conditions for forming the films.

There was used a CVD apparatus equipped with a high-frequency power source with a frequency of 27.12 MHz and a maximum output of 2 kW, a matching box, a metallic cylindrical plasma-treating chamber with a diameter of 300 mm and a height of 450 mm, and a hydraulic rotary vacuum pump for evacuating the treating chamber. A plastic base member was placed on flat parallel plates in the treating chamber. After a hexamethyldisiloxane was introduced at a rate of 3 sccm, and oxygen was introduced at a rate of 45 sccm, a 50-watt high-frequency output was generated by the high-frequency oscillator for 2 seconds to form a film to thereby obtain a closely adhered layer. Next, a 200-watt high-frequency output was generated by the high-frequency oscillator for 50 seconds to form a film to thereby obtain an inorganic barrier layer of silicon oxide, resulting in a PET film A1 coated with the inorganic barrier layer. The obtained PET film A1 coated with the inorganic barrier layer exhibited a water vapor permeability of $2 \times 10^{-2}$ g/m²/day as measured in an atmosphere of 40° C.90% RH.

Example 1

A polymer solution was obtained by diluting a polyallylamine (PAA-15C, produced by Nittobo Medical Co., aqueous solution, solid component of 15%) as the ionic polymer with the water so that the solid component thereof was 5% by mass. As the crosslinking agent, on the other hand, γ-glycidoxypropyltrimethoxysilane was dissolved in the water so that the amount thereof was 5% by mass to prepare a solution of the crosslinking agent. Next, the polymer solution and the solution of the crosslinking agent were mixed together so that the amount of the γ-glycidoxypropyltrimethoxysilane was 15 parts by mass per 100 parts by mass of the polyallylamine. To the mixed solution, the crosslinked product of Na polyacrylate (TAFTIC HU-820E, produced by Toyobo Co., aqueous dispersion, solid component of 13%) was added as the hygroscopic agent so that the amount thereof was 400 parts by mass per 100 parts by mass of the polyallylamine, to which the water was further added so that the amount of the solid component was 5%. The mixture was stirred well to obtain a coating solution A for forming the water-trapping layer.

By using a bar coater, the above coating solution A was applied onto the inorganic barrier layer-coated PET film A1 on the side where no inorganic barrier layer has been formed. The film applied with the above coating solution was heat-treated in a box-type electric oven under the conditions of a peak temperature of 120° C. and a peak temperature-holding time of 10 seconds. There was formed a water-trapping layer of a thickness of 3 μm, and a coating film B1 was obtained. In the same way, the coating solution A was applied onto the inorganic barrier layer-coated PET film A1 on the side where the inorganic barrier layer has been formed, and was heat-treated to obtain a coating film B2 on which the water-trapping layer has been formed.

Next, in the gloved box in which the nitrogen concentration has been adjusted to be not lower than 99.95%, the inorganic barrier layer-formed surface of the inorganic barrier layer-coated PET film A1 was dry-laminated on the water-trapping layer-formed surface of the coating film B1 via an urethane adhesive of a thickness of 1.8 μm to thereby obtain a laminated film C1. Further, the water-trapping layer-formed surface of the coating film B2 was dry-laminated on the laminated film C1 on the side of the coating film B1 via the urethane adhesive of a thickness of 1.8 μm to obtain a water barrier laminate 1 shown in FIG. 1.

Example 2

In the gloved box in which the nitrogen concentration has been adjusted to be not lower than 99.95%, a laminated film C2 was obtained by dry-laminating the surface of the inorganic barrier layer-coated PET film A1 where no inorganic barrier layer has been formed on the water-trapping layer-formed surface of the coating film B2 via the urethane adhesive of a thickness of 1.8 μm. Furthermore, the water trapping layer-formed surface of the coating film B2 was dry-laminated on the laminated film C2 on the side of the inorganic barrier layer-coated PET film via the urethane adhesive of a thickness of 1.8 μm to thereby obtain a water barrier laminate 2 shown in FIG. 2.

Example 3

A main resin (DA105 produced by Arakawa Kagaku Co.) and a curing agent (CL100A produced by Arakawa Kagaku Co.) were mixed together at a weight ratio of 5:2, to which 2-butanone was added so that the solid component was 35% by mass, thereby preparing a coating solution D for forming an organic layer.

By using a bar coater, the coating solution D was applied onto the water-trapping layer-formed surface of the coating film B2. The film applied with the above coating solution was heat-treated in the box-type electric oven under the conditions of a peak temperature of 150° C. and a peak temperature-holding time of 2 minutes to form a smoothing layer of a thickness of 4 μm. Next, a second inorganic barrier layer of silicon oxide was formed on the smoothing layer under the same conditions as for the film A1. On the second inorganic barrier layer, there were further formed a second water-trapping layer, a smoothing layer and a third inorganic barrier layer in this order under the same conditions as those described above to thereby obtain a water barrier laminate 3 shown in FIG. 3.

Example 4

A water barrier laminate 4 was obtained in the same manner as in Example 1 except that a commercially available vapor deposited PET film (GL-RD produced by Toppan Insatsu Co., water vapor permeability of 0.15 $g/m^2/day$) formed by the PVD method was used instead of the inorganic barrier layer-coated PET film A1.

Example 5

A water barrier laminate 5 was obtained in the same manner as in Example 1 except that a calcium oxide-containing LLDPE master batch (Bell-CML produced by Ohmi Kagaku Kogyo Co.) of the hygroscopic material and an LDPE (Sumikathene produced by Sumitomo Kagaku Co.) of the matrix resin layer were mixed so that the amount of the hygroscopically working component (here, calcium oxide) was 25 parts by mass per 75 parts by mass of the resin component, and the mixture thereof was extruded by an extruder so as to be laminated in a thickness of 10 μm on the inorganic barrier layer-coated PET film A1, instead of applying the coating solution A as the water-trapping layer by using the bar coater in Example 1.

Example 6

An inorganic barrier film E1 was prepared by laminating two sheets of a commercially available vapor deposited PET film (GX-P-F produced by Toppan Insatsu Co., an inorganic barrier layer of aluminum oxide) formed by the PVD method on a laminate that was obtained by dry-laminating a water barrier layer on the surface of a PET base material using the urethane adhesive of a thickness of 1.8 μm. Next, the surface of the PET base material of the water barrier film laminate E1 was dry-laminated on the surface of the commercially available vapor evaporated PET film formed by the PVD method by using the urethane adhesive of a thickness of 1.8 μm to form an inorganic barrier film E2.

The coating solution A was applied onto both surfaces of the inorganic barrier film E2 in the same manner as in Example 3 to form a water-trapping layer. Next, the coating solution D was applied thereon to successively form a smoothing layer of a thickness of 1 μm. A coating film F1 was thus formed.

In the gloved box in which the nitrogen concentration has been adjusted to be not lower than 99.95%, a laminated film G1 was formed by dry-laminating the inorganic barrier layer-formed surface of the inorganic barrier film E1 on one surface of the coating film F1 via the urethane adhesive of a thickness of 1.8 μm. Next, the surface of the inorganic barrier film E1 where no inorganic barrier layer has been formed was dry-laminated on one surface of the coating film F1 via the urethane adhesive of a thickness of 1.8 μm to form a laminated film G2. Furthermore, the surface of the laminated film G1 where the water-trapping layer and the smoothing layer have been formed was dry-laminated on the surface of the laminated film G2 where neither the water-trapping layer nor the smoothing layer has been formed, via the adhesive to obtain a water barrier laminate 6.

Example 7

A water barrier laminate 7 was fabricated in the same manner as in Example 6 except that a coating solution H was prepared by blending a main resin (DA105 produced by Arakawa Kagaku Co.) and a curing agent (D110N produced by Mitsui Kagaku Co.) at a ratio of 4:1, and the coating solution was applied between the inorganic barrier film E2 and the water-trapping layer to form an anchoring layer of a thickness of 1 μm.

Example 8

A water barrier laminate 8 was fabricated in the same manner as in Example 7 except that, instead of the inorganic barrier film E1 in Example 7, the surface of the vapor deposited PET film where no inorganic barrier layer has been formed was dry-laminated on one surface of the coating film F1 via the urethane adhesive of a thickness of 1.8 μm.

Comparative Example 1

Figure 4:
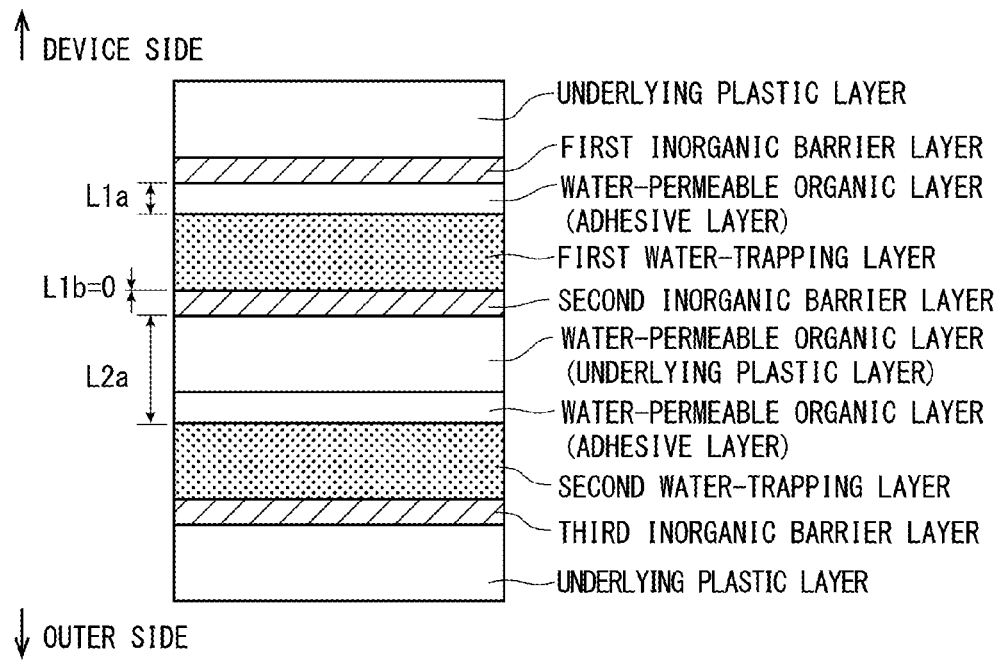
FIG. 4 is a view illustrating a structure of layers that does not satisfy the requirements of the water barrier laminate of the present invention.
Figure 5:
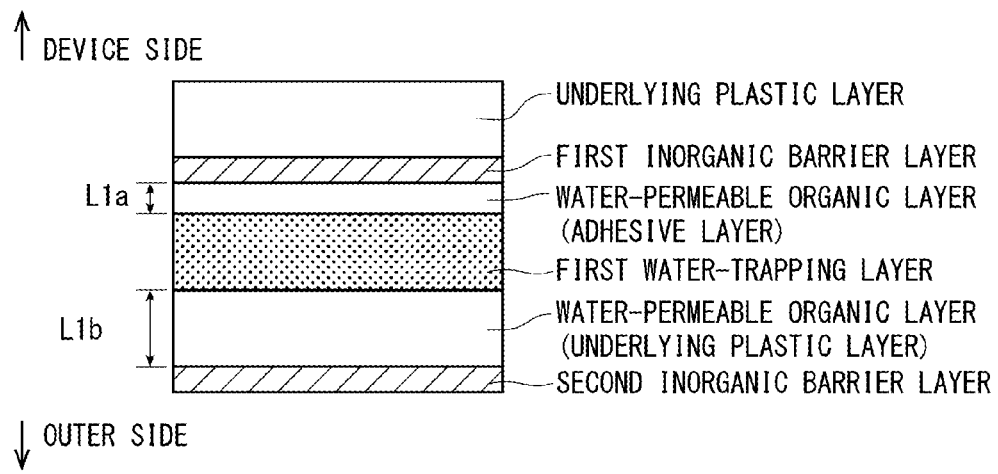
FIG. 5 is a view illustrating a structure of layers that does not satisfy the requirements of the water barrier laminate of the present invention.
Figure 6:
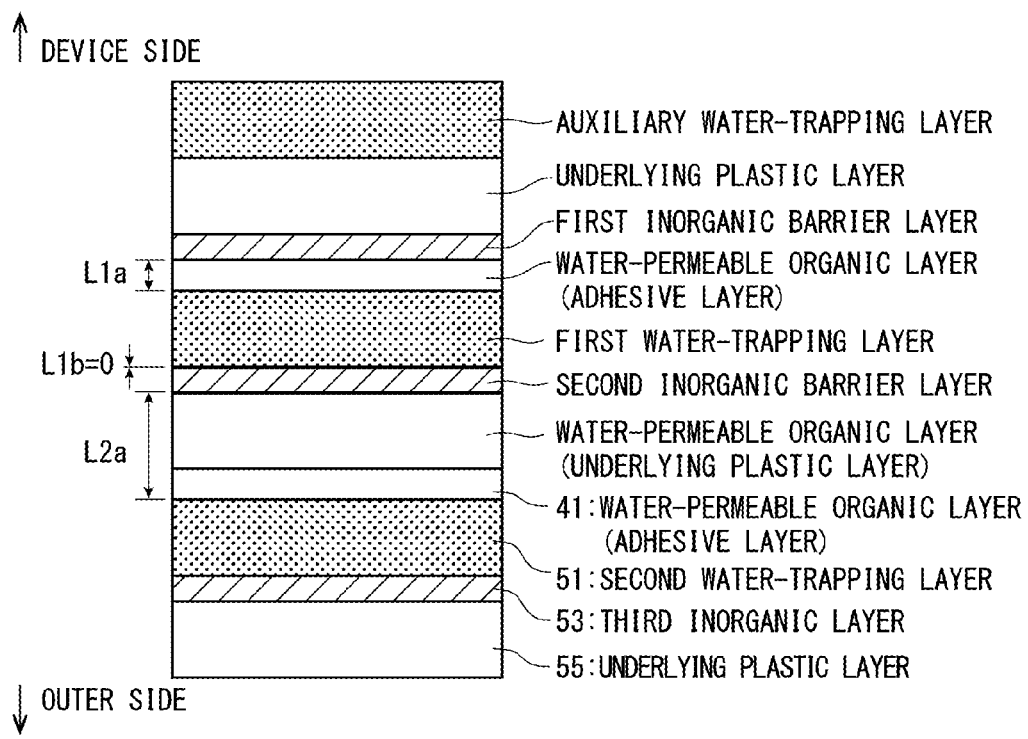
FIG. 6 is a view illustrating a structure of layers that does not satisfy the requirements of the water barrier laminate of the present invention.

In the gloved box in which the nitrogen concentration has been adjusted to be not lower than 99.95%, a laminated film C2 was obtained by dry-laminating the inorganic barrier layer-formed surface of the inorganic barrier layer-coated PET film A1 on the water-trapping layer-formed surface of the coating film B2 via the urethane adhesive of a thickness of 1.8 μm. Furthermore, the water-trapping layer-formed surface of the coating film B2 was dry-laminated on the laminated film C2 on the side of the coating film B2 via the urethane adhesive of a thickness of 1.8 μm to thereby obtain a water barrier laminate 8 shown in FIG. 4. The water barrier laminate 8 possessed a distance L1b=0 as shown in FIG. 4.

Comparative Example 2

In the gloved box in which the nitrogen concentration has been adjusted to be not lower than 99.95%, a water barrier laminate 9 was obtained by dry-laminating the inorganic barrier layer-formed surface of the inorganic barrier layer-coated PET film A1 on the water-trapping layer-formed surface of the coating film B1 via the urethane adhesive of a thickness of 1.8 μm.

Comparative Example 3

In the gloved box in which the nitrogen concentration has been adjusted to be not lower than 99.95%, a laminated film C3 was obtained by dry-laminating the surface of the coating film B1 where no water-trapping layer has been formed on the water-trapping layer-formed surface of the coating film B2 via the urethane adhesive of a thickness of 1.8 μm. Furthermore, the water-trapping layer-formed surface of the coating film B2 was dry-laminated on the laminated film C3 on the side of the coating film B2 via the urethane adhesive of a thickness of 1.8 μm to thereby obtain a water barrier laminate 8 shown in FIG. 4.

<Test for Evaluation>

The samples or the laminates fabricated as described above were measured for their properties by the methods described above to obtain the results as shown in Table 1. As a control experiment, the same evaluation was made using glass plates instead of barrier films.

TABLE 1

| | Distances among the layers (μm) | | | Number of water-trap layers | Innermost aux. water-trap layer | Initial water vapor permeability g/m²/day | Sustenance of trapping performance | Removal of water from the sealing agent |
|---|---|---|---|---|---|---|---|---|
| | L1a | L2a | L1b | | | | | |
| Example 1 | 1.8 | 1.8 | 50 | 2 | — | ≤5 × 10⁻³ | ○ | ○ |
| Example 2 | 0 | 1.8 | 51.8 | 2 | — | ≤5 × 10⁻³ | ○ | ○ |
| Example 3 | 0 | 0 | 4 | 2 | — | ≤5 × 10⁻³ | ○ | ○ |
| Example 4 | 1.8 | 1.8 | 12 | 2 | — | | ○ | ○ |
| Example 5 | 1.8 | 1.8 | 50 | 2 | — | | ○ | ○ |
| Example 6 | 0 | 2.8 | 14.8 | 3 | yes | ≤5 × 10⁻³ | ⊚ | ○ |
| Example 7 | 1 | 2.8 | 14.8 | 3 | yes | ≤5 × 10⁻³ | ⊚ | ○ |
| Example 8 | 1 | 2.8 | 14.8 | 3 | yes | ≤5 × 10⁻³ | ⊚ | ○ |
| Comp. Ex. 1 | 1.8 | 51.8 | 0 | 2 | — | ≤5 × 10⁻³ | X | X |
| Comp. Ex. 2 | 1.8 | — | 50 | 1 | — | ≤5 × 10⁻³ | X | X |
| Comp. Ex. 3 | 1.8 | 51.8 | 0 | 2 | yes | ≤5 × 10⁻³ | X | Δ |
| Control exp. | — | — | — | — | — | ≤5 × 10⁻³ | ⊚ (no change) | X |

DESCRIPTION OF REFERENCE NUMERALS

1: water barrier multilayered structure
11: underlying plastic layer
13: first inorganic barrier layer
21: water-permeable organic layer (adhesive layer)
31: first water-trapping layer
33: water-permeable organic layer (underlying plastic layer)
35: second inorganic barrier layer
41: water-permeable organic layer (adhesive layer)
51: second water-trapping layer
53: third inorganic barrier layer
55: water-permeable organic layer (underlying plastic layer)

The invention claimed is:

1. A water barrier laminate that includes a plurality of inorganic barrier layers and a plurality of water-trapping layers, and is used for preventing the water from permeating into a device, characterized in that:
    said plurality of inorganic barrier layers include a first inorganic barrier layer, a second inorganic barrier layer and a third inorganic barrier layer, and said plurality of water-trapping layers include a first water-trapping layer and a second water-trapping layer;
    said first to third inorganic barrier layers and said first and second water-trapping layers form a basic alternating layer structure in which the first inorganic barrier layer, the first water-trapping layer, the second inorganic barrier layer, the second water-trapping layer and the third inorganic barrier layer are arranged in this order from the side facing the device to the outer side;
    a water-permeable underlying plastic layer is provided on one side of at least one of said first to third inorganic barrier layers;
    a distance L1a between said first water-trapping layer and said first inorganic barrier layer and a distance L2a between said second water-trapping layer and said second barrier satisfy the conditions represented by the following formulas (1) and (2):

$$L1a < 3 \text{ μm} \quad (1)$$

$$L2a < 3 \text{ μm} \quad (2)$$

and
    a distance L1b between said second inorganic barrier layer and said first water-trapping layer is set to satisfy the condition represented by the following formula (3):

$$L1b > 3 \text{ μm} \quad (3)$$

by interposing a water-permeable organic layer between these two layers.

2. The water barrier laminate according to claim 1, wherein said distance L1b is not more than 50 V m.

3. The water barrier laminate according to claim 1, wherein each of said plurality of inorganic barrier layers has a water permeability of not more than 0.1 g/m²/day at 40° C., 90% RH.

4. The water barrier laminate according to claim 1, wherein the water-permeable organic layer used for adjusting the distance is the underlying plastic layer that is present on one side of the second inorganic barrier layer.

5. The water barrier laminate according to claim 1, wherein an adhesive layer is present between the first water-trapping layer and the second inorganic barrier layer.

6. The water barrier laminate according to claim 1, wherein any one or all of said plurality of inorganic barrier layers are vapor deposited layers of an aluminum oxide.

7. The water barrier laminate according to claim 1, wherein a laminated structure including a water-trapping layer is further formed on the outer side of the third inorganic barrier layer.

8. The water barrier laminate according to claim 1, wherein said plurality of water-trapping layers are formed of resin layers containing hygroscopic inorganic particles, hygroscopic ionic polymer layers or hygroscopic non-ionic polymer layers.

9. The water barrier laminate according to claim 8, wherein said plurality of water-trapping layers all have a structure formed by dispersing a hygroscopic agent in a hygroscopic matrix of an ionic polymer, the hygroscopic agent having an ultimate humidity lower than that of said matrix.

10. The water barrier laminate according to claim 1, wherein the water barrier laminate is used being stuck to a device with an adhesive.

* * * * *